(12) United States Patent
Campardo et al.

(10) Patent No.: US 11,069,587 B2
(45) Date of Patent: Jul. 20, 2021

(54) INTEGRATED SEMICONDUCTOR DEVICE AND PROCESS FOR MANUFACTURING AN INTEGRATED SEMICONDUCTOR DEVICE

(71) Applicant: STMicroelectronics S.r.l., Agrate Brianza (IT)

(72) Inventors: Giovanni Campardo, Bergamo (IT); Marco Omar Ghidoni, Melzo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/905,486

(22) Filed: Jun. 18, 2020

(65) Prior Publication Data

US 2020/0402874 A1 Dec. 24, 2020

(30) Foreign Application Priority Data

Jun. 20, 2019 (IT) .......................... 102019000009660

(51) Int. Cl.
*H01L 23/13* (2006.01)
*H01L 23/00* (2006.01)

(52) U.S. Cl.
CPC .............. *H01L 23/13* (2013.01); *H01L 24/13* (2013.01); *H01L 24/29* (2013.01); *H01L 24/45* (2013.01); *H01L 24/73* (2013.01); *H01L 24/83* (2013.01); *H01L 24/85* (2013.01); *H01L 2224/13* (2013.01); *H01L 2924/18165* (2013.01)

(58) Field of Classification Search
CPC .......... H01L 23/13; H01L 24/13; H01L 24/29
See application file for complete search history.

(56) References Cited

U.S. PATENT DOCUMENTS

| 5,952,611 A | 9/1999 | Eng et al. |
|---|---|---|
| 9,105,647 B2 * | 8/2015 | Hu ...................... H01L 25/0657 |
| 2008/0203553 A1 | 8/2008 | Hsu et al. |
| 2010/0072596 A1 | 3/2010 | Pagaila et al. |

FOREIGN PATENT DOCUMENTS

| EP | 3182449 A1 | 6/2017 |
|---|---|---|
| JP | S6159860 A | 3/1986 |

* cited by examiner

*Primary Examiner* — Errol V Fernandes
(74) *Attorney, Agent, or Firm* — Slater Matsil, LLP (57) ABSTRACT

An integrated semiconductor device and a method for manufacturing the integrated semiconductor device are disclosed. In an embodiment an integrated semiconductor device includes a supporting substrate having a first substrate face and a second substrate face opposite to the first substrate face, a semiconductor die having a first die face coupled to the first substrate face of the supporting substrate, the first die face including first die contact pads, wherein the supporting substrate has at least one through opening, wherein the first die contact pads are arranged facing the through opening, and wherein the supporting substrate comprises first substrate contact pads connected by first bonding wires to the respective first die contact pads through the through opening.

25 Claims, 8 Drawing Sheets

INTEGRATED SEMICONDUCTOR DEVICE AND PROCESS FOR MANUFACTURING AN INTEGRATED SEMICONDUCTOR DEVICE

CROSS-REFERENCE TO RELATED APPLICATIONS

This application claims priority to Italian Patent Application No. 102019000009660, filed on Jun. 20, 2019, which application is hereby incorporated herein by reference.

TECHNICAL FIELD

The present invention relates to an integrated semiconductor device and a process for manufacturing an integrated semiconductor device.

BACKGROUND

As is known, the "packages" of integrated electronic devices have a dual task of providing support and protection from a mechanical point of view and allowing the electrical connection to the outside, typically with the connection to a board. A very popular solution is the BGA ("Ball Grid Array") type. In this case, a semiconductor die is glued on a face of a substrate having on the opposite face an array of conductive balls ("balls") intended to be welded to an electronic board for the electrical and mechanical connection. The substrate is normally a multilayer plate or board and has contact pads on the face bonded to the semiconductor die. Through connection lines possibly arranged on multiple levels of the multilayer structure, the contact pads are electrically coupled to respective balls on the opposite face of the substrate. The semiconductor die is normally electrically connected to the contact pads through "bonding wires" or the so-called "flip chip" technique. In the first case, the substrate contact pads are arranged around the area on which the die is fixed and may be arranged in multiple lines or orders, according to the number of contacts foreseen by the specific application and the available space. Corresponding contact pads are formed on the die, usually in one of its peripheral regions, possibly arranged in multiple lines here as well. Each die contact pad is connected through a metal connection wire to a respective substrate contact pad. The whole is then embedded in a protective resin. The wire bonding technique is very popular as it is reliable and relatively inexpensive. However, the length of the connections can be a limit. In fact, both the signal lines and the supply lines must be brought from the die center, where the integrated circuits are arranged, to the periphery, where the contact pads are, and then directed to the substrate up to the corresponding BGA balls. The overall length of the lines may also be increased due to crowding, which requires arranging the contact pads on wider areas and, accordingly, forming connections over longer distances. For example, if, due to the number of connections indicated by the design, the contact pads are arranged on more than one line, clearly not all the connections may be formed between adjacent contact pads and some of them need to be overpassed. The length of the connections may lead to limitations when high performance is sought, both in terms of voltage supply accuracy and frequencies. In fact, the length of the connections determines both their parasitic resistance, which may cause inadmissible voltage drops with power supplies of the order of 1V, and (auto and mutual) parasitic inductance, which may become problematic at particularly high frequency.

With the flip chip technique, die contact structures (in general pillars or "solder bumps") are formed on its face which is coupled to the BGA substrate. The connections are formed by welding the die contact structures directly to the substrate contact pads. All the connections are therefore in the die area, generally with the signal lines in the peripheral portion and the supply and ground lines in the central portion. The number of contacts available is high compared to the bonding wire techniques. If on one hand the flip chip technique allows the length of the connections to be minimized and in practice it is not affected by the density of the contacts, on the other hand, however, it is more expensive and less reliable.

SUMMARY

Embodiments provide an integrated device and a process for manufacturing an integrated device which allow the described limitations to be overcome or at least mitigated.

BRIEF DESCRIPTION OF THE DRAWINGS

For a better understanding of the invention, some embodiments thereof will now be described, purely by way of non-limiting example and with reference to the accompanying drawings, in which.

DETAILED DESCRIPTION OF ILLUSTRATIVE EMBODIMENTS

Figure 1:
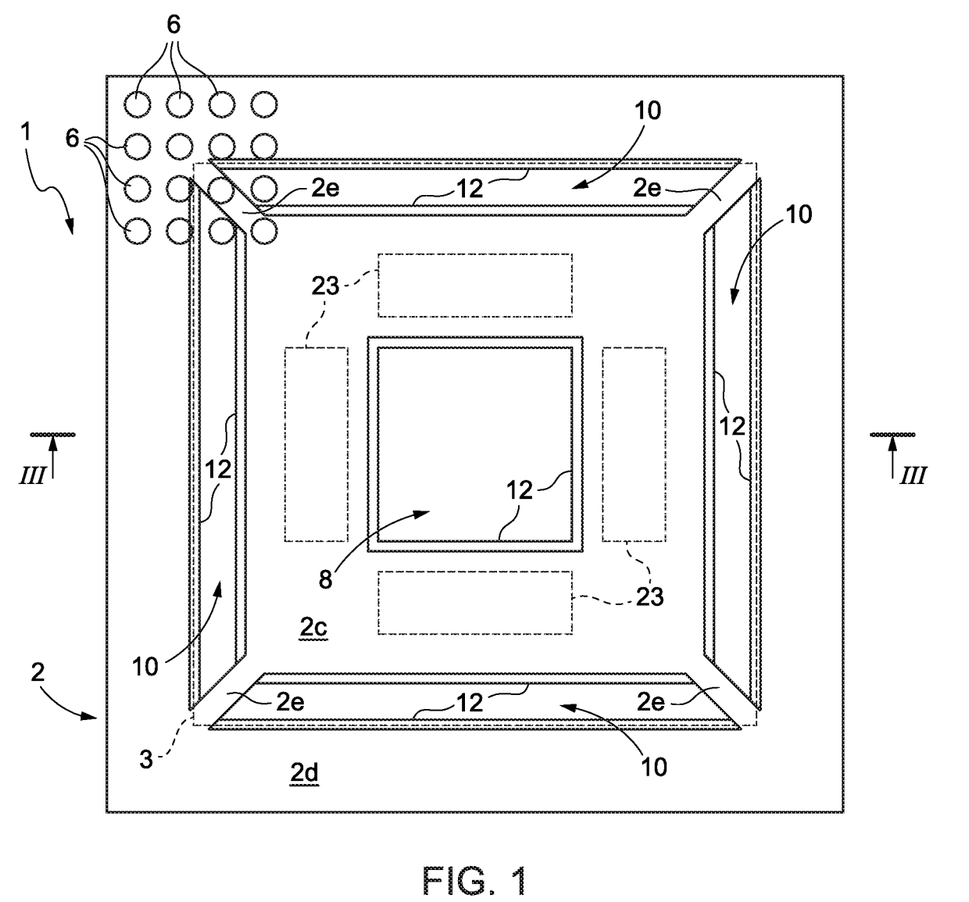
FIG. 1 is a plan view from below of an integrated device according to an embodiment, with parts removed for the sake of clarity.
Figure 2:
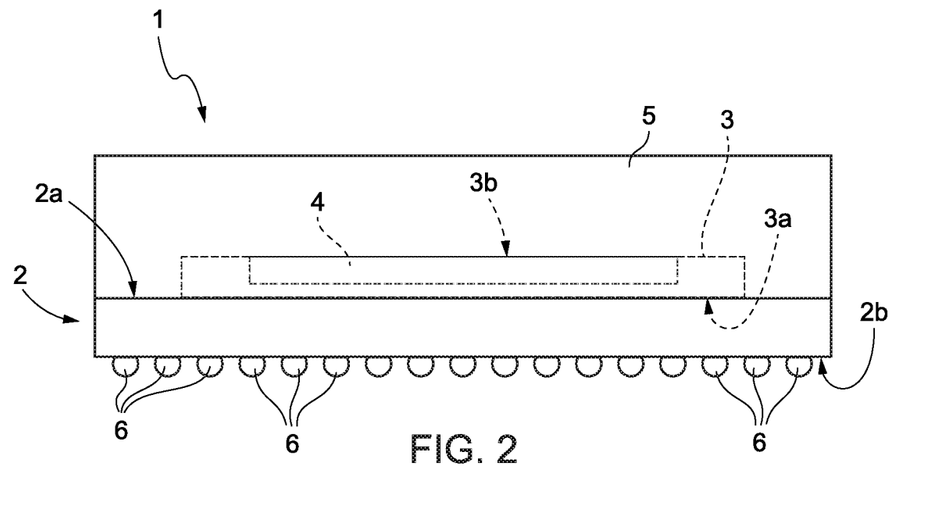
FIG. 2 is a side view of the integrated device of FIG. 1.

With reference to FIGS. 1 and 2, an integrated semiconductor device according to an embodiment is indicated as a whole with numeral 1 and comprises a supporting substrate 2, a semiconductor die 3, in which an electronic or microelectromechanical device 4 is formed, and a protective capsule 5. In the illustrated example, the integrated device 1 defines a BGA ("Ball Grid Array")-type package.

Figure 3:
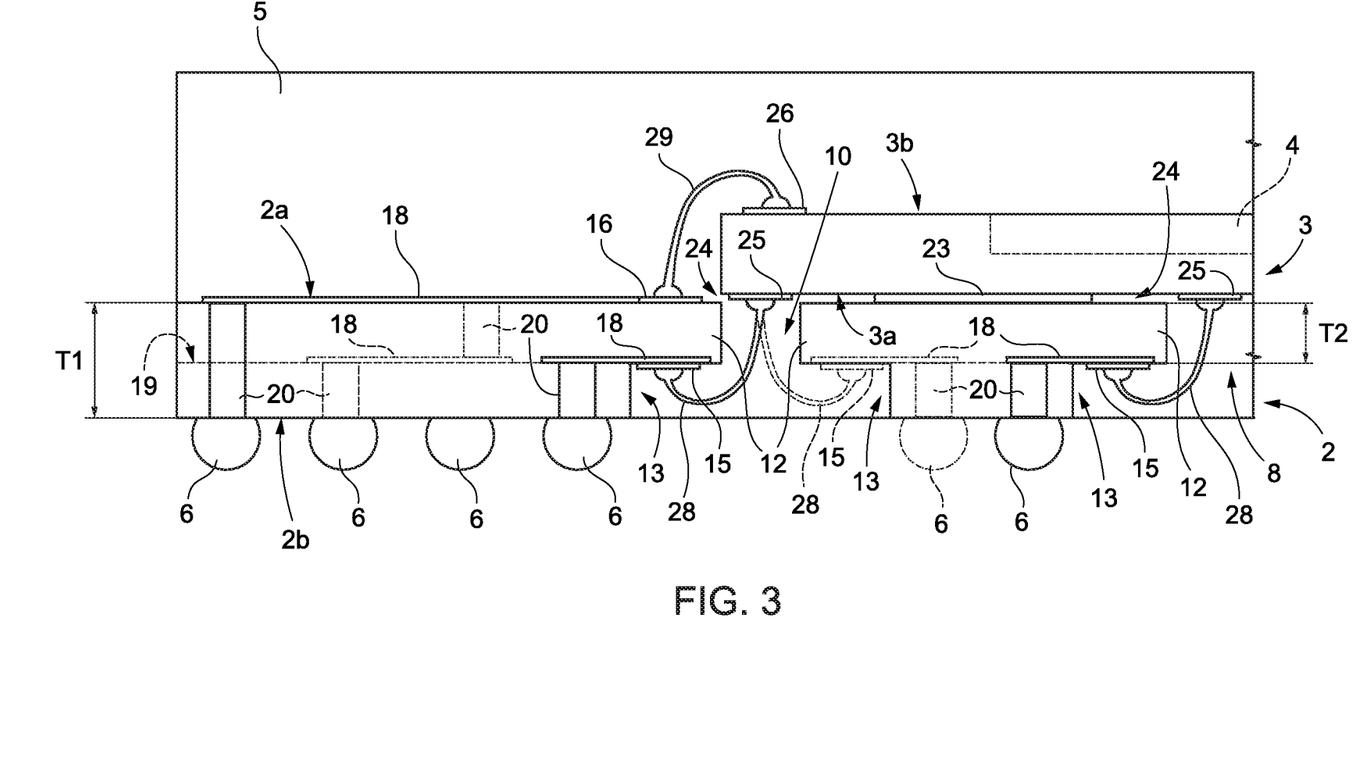
FIG. 3 is a cross-section, taken along the line III-III of FIG. 1 and enlarged, of a portion of the integrated device of FIG. 1.

The supporting substrate 2 may be formed of any non-conductive material having suitable mechanical strength properties, such as FR-4 or BT (Bismaleimide Triazine), but also intrinsic silicon. As shown in FIG. 3, the supporting substrate 2 has a first face 2a bonded to the semiconductor die 3, a second face 2b opposite to the first face 2a and a first thickness T1 defined by a distance between the first face 2a and the second face 2b. The second face 2b of the supporting substrate 2 is provided with an array of contact structures 6 configured to be welded on a board of an electronic system in which the integrated device 1 is incorporated. The contact structures 6 in an embodiment are of BGA-type balls.

The supporting substrate 2 has through openings (see also FIG. 1), in particular, in one embodiment, a first central through opening 8 and second through openings 10 arranged around the first through opening 8. By "through" it is understood here that it crosses the entire first thickness T1 of the supporting substrate 2 from the first face 2a to the second face 2b. The first through opening 8 is laterally delimited by an inner frame portion 2c of the supporting substrate 2, for example of quadrangular shape, bonded to an outer frame portion 2d by beams 2e at the vertices. In the embodiment of FIGS. 1-5, the second through openings 10 are adjacent to respective sides of the inner frame portion 2c and outer frame portion 2d of the supporting substrate 2 (FIG. 1). However, it is understood that the number, the shape and the arrangement of the through openings may be modified according to design preferences.

The supporting substrate 2 further defines steps 12 adjacent to respective through openings 8, 10 (FIGS. 1 and 3-5). More precisely, a respective step 12 extends along at least one side of each first through opening 8 and second through opening 10. In one embodiment, all sides of the first through opening 8 and the two longer sides of each second through opening 10 have a respective adjacent step 12. The steps 12 have opposite faces parallel to the first face 2a and second face 2b of the supporting substrate 2 and a second thickness T2 smaller than the first thickness T1. In one embodiment, the steps 12 have a first face defined by a portion of the first face 2a of the supporting substrate 2, and therefore aligned with it; and a second opposite face, arranged on an intermediate plane between the first face 2a and the second face 2b. Therefore, each step 12 defines a recess 13 adjacent to a respective first through opening 8 or second through opening 10, open towards the second face 2b of the supporting substrate 2 and closed in the opposite direction.

The supporting substrate 2 comprises first substrate contact pads 15 (FIGS. 3-5) arranged on at least some of the steps 12. The first substrate contact pads 15 are aligned in proximity to the edge of the respective steps 12 adjacent to the through openings 8, 10. Optionally, as in the illustrated example, the supporting substrate 2 may comprise second substrate contact pads 16, on the second face 2b around the semiconductor die 3 (FIG. 3).

The first substrate contact pads 15 are coupled to respective connection structures 6 through conductive lines 18 (FIG. 6) running inside the supporting substrate 2, in proximity to the second face 2b and/or on intermediate layers 19. Interconnection vias 20 may be used to connect conductive lines 18 located on different levels.

The second substrate contact pads 16 (FIG. 6) are connected to respective connection structures 6 through further conductive lines 18 and interconnection vias 20. The conductive lines 18 for the second substrate contact pads 16 may be formed on the first face 2a of the substrate 2, on intermediate layers 19 or also on the second face 2b. The interconnection vias 20 may extend through the entire first thickness T1 of the supporting substrate 2 or between one of the faces 2a, 2b and intermediate layers 18 or between intermediate layers 18, so as to connect respective portions of the conductive lines 18.

The semiconductor die 3 has a first face 3a and a second face 3b opposite to one another. The first face 3a of the semiconductor die 3 is bonded to the first face 2a of the supporting substrate 2 through polymerized adhesive tape strips 23 (FIGS. 1, 3 and 4), for example arranged on the inner frame portion 2C (FIGS. 1, 4 and 5) around the first central through opening 8. The adhesive tape strips 23 have such a thickness as to create passages 24 between the supporting substrate 2 and the semiconductor die 3 and allow a flow of resin molding compound through the through openings 8, 10.

The semiconductor die 3 is provided with first die contact pads 25 on the first face 3a (FIGS. 3-5) and, optionally, with second die contact pads 26 on the second face 3b (FIG. 3). Also, the semiconductor die 3 occupies a portion of the supporting substrate 2 around the first through openings 8 and second through openings 10. Possibly, the semiconductor die 3 may be aligned with the second through openings 10 or have a slightly smaller extension. The first die contact pads 25 are arranged on portions of the first face 3a of the semiconductor die 3 corresponding to the first openings 8 and the second openings 10 of the supporting substrate 2, in particular along respective steps 12 where the first substrate contact pads 15 are housed.

Figure 4:
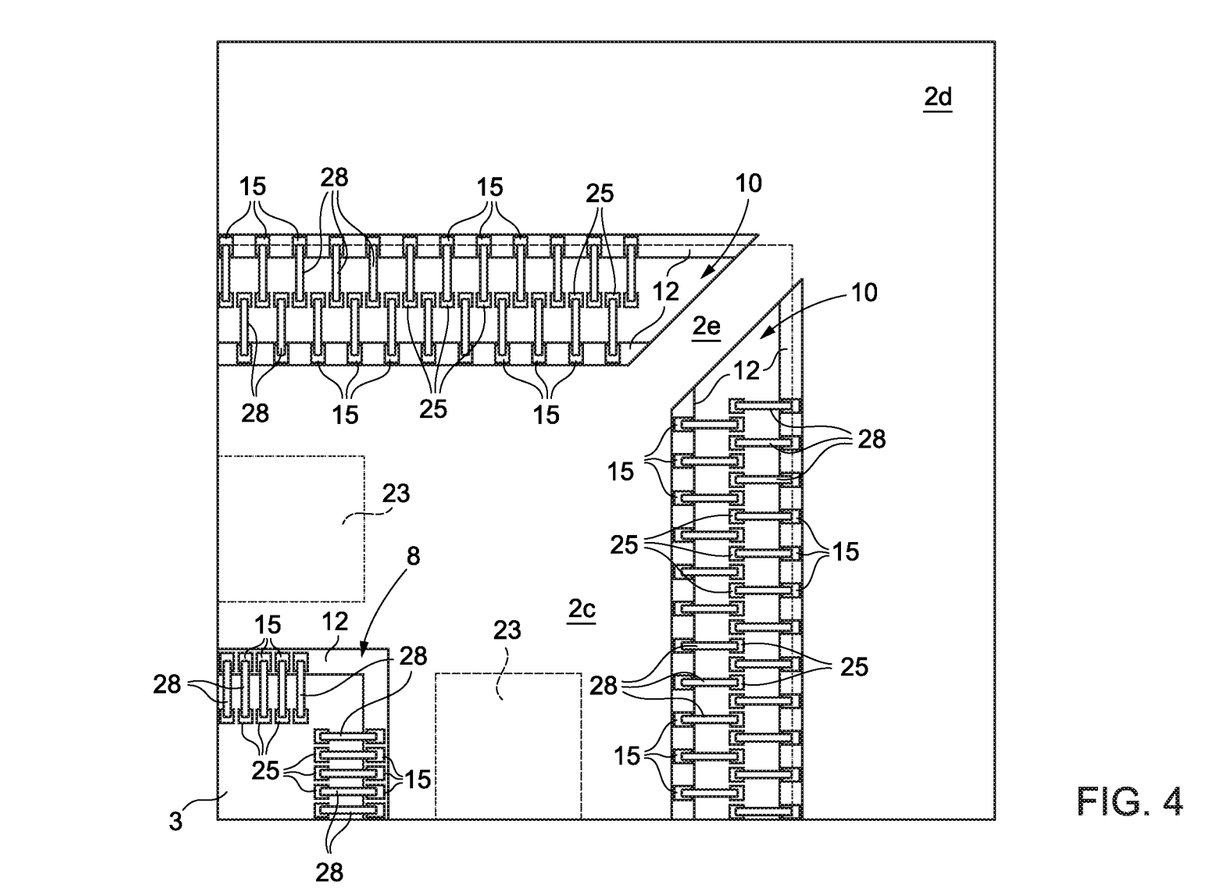
FIG. 4 is an enlarged plan view from below of a detail of the integrated device of FIG. 1.
Figure 5:
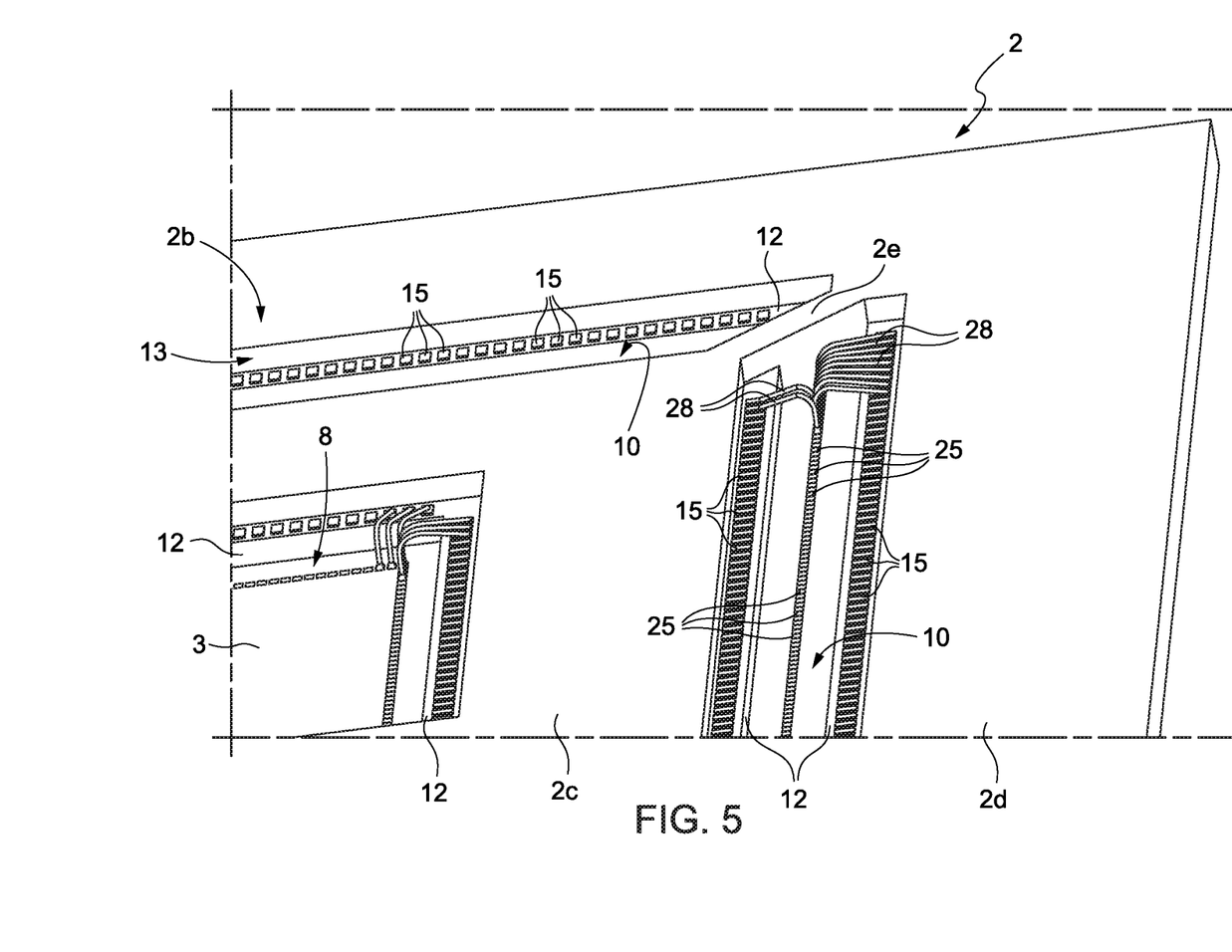
FIG. 5 is a perspective view of the detail of FIG. 4.

The first die contact pads 25 are connected to respective first substrate contact pads 15 through bonding wires 28, (FIGS. 3-5). In one embodiment, the bonding wires 28 are shaped so as not to project beyond the second face 2b of the supporting substrate 2.

The second die contact pads 26 (FIG. 3) are arranged along peripheral portions of the second face 3b of the semiconductor die 3 and are connected to respective second substrate contact pads 16 through bonding wires 29.

The protective capsule 5 of resin molding compound incorporates the semiconductor die 3, the second substrate contact pads 16, the second die contact pads 26 and the bonding wires 28 and extends at least in part on the first face 2a of the supporting substrate 2. Further, the protective capsule 5 fills the through openings 8, 10 through the passages 24 and extends to the second face 2b of the supporting substrate 2. Therefore, also the first substrate contact pads 15, the first die contact pads 25 and the bonding wires 28, which do not project beyond the second face 2b, are embedded in the resin molding compound of the protective capsule 5, which defines a planar surface and continues with the second face 2b.

The integrated device 1 may be formed by applying the adhesive strips 23 to the first face 2a of the supporting substrate 2 and bonding the semiconductor die 3 (either a strip or a wafer containing a plurality of semiconductor dice 3) to the supporting substrate 2. The supporting substrate 2 with the adhesive strips 23 allows saving a sacrificial support or carrier and, also, the positioning of the semiconductor die 3 is very accurate. The glue present on the adhesive strips 23 is then polymerized, so as to make the coupling between the supporting substrate 2 and the semiconductor die 3 permanent. After forming the bonding wires 29 between the second die contact pads 26 and the second substrate contact pads 16, if present, the assembly of the supporting substrate 2 and the semiconductor die 3 is turned around and the bonding wires 28 are formed between the first die contact pads 25 and the first substrate contact pads 15, through the second face 2b of the supporting substrate 2.

The protective capsule 5 (FIGS. 2 and 3) is then formed with the aid of a mold (not shown), by injecting the resin molding compound also through the through openings 8, 10 (FIGS. 1, 3, 4 and 5), which are filled, and the passages 24 (FIG. 3).

Figure 6:
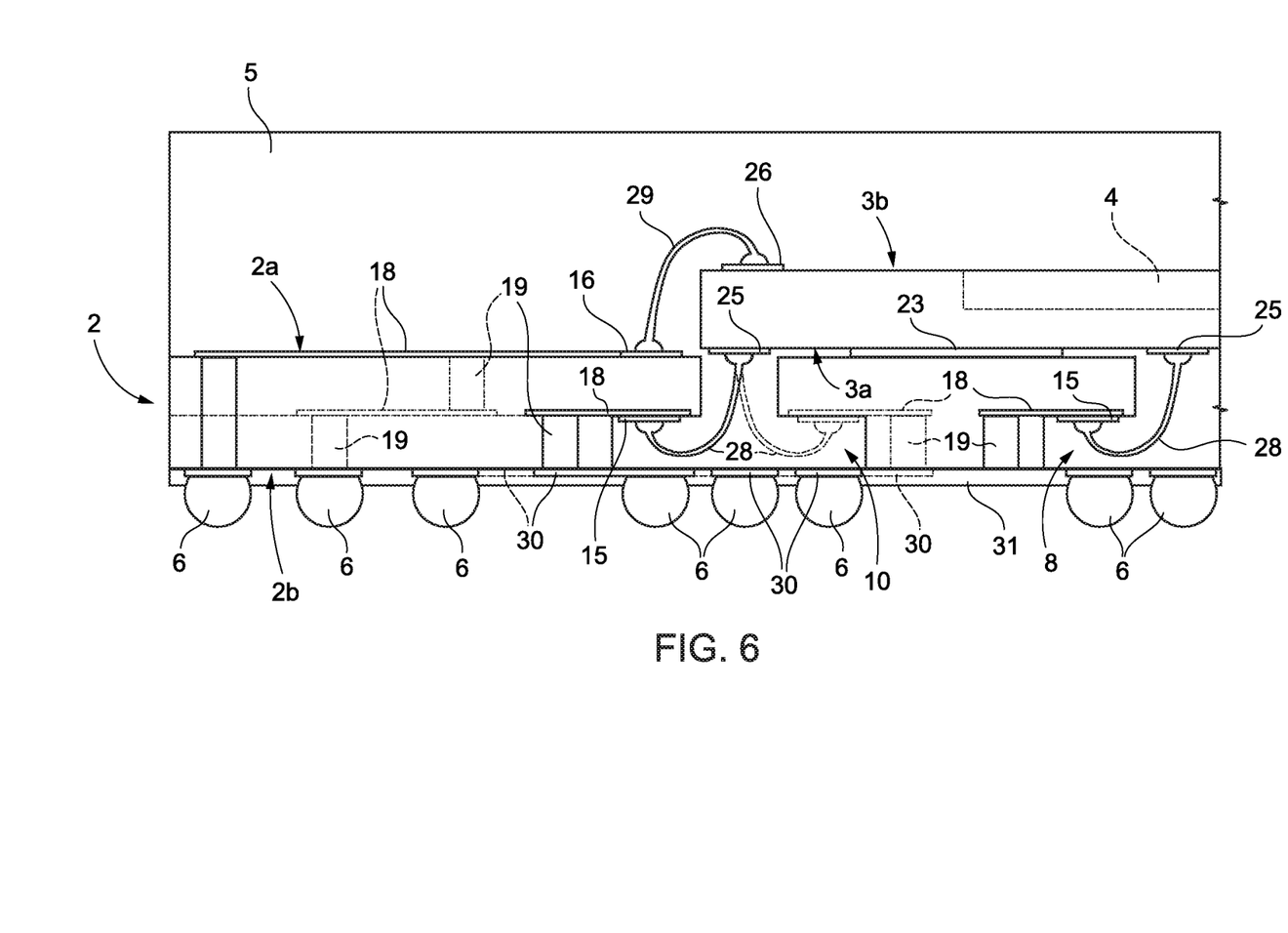
FIG. 6 is a cross-section of a portion of an integrated device according to a different embodiment.
Figure 7:
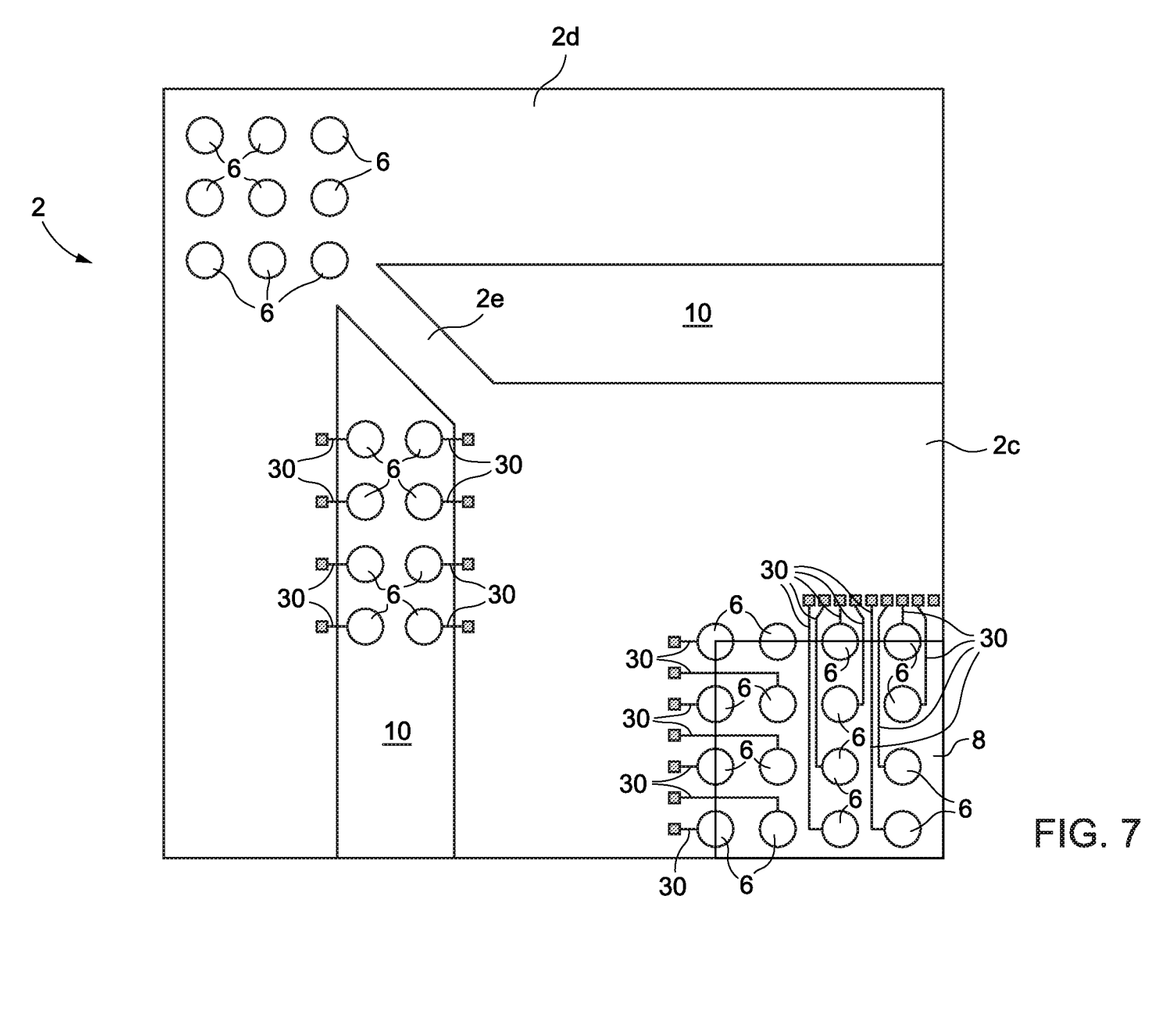
FIG. 7 is a plan view from below of a portion of the integrated device of FIG. 6.

With reference to FIGS. 6 and 7, in one embodiment connection lines 30 are formed at least in part on the second face 2b of the substrate 2 and are protected by a passivation layer 31. The connection lines 30 offer a further routing level between the substrate contact pads 15, 16. Further, the connection lines 30 are not constrained to remain entirely on the substrate 2, but may extend in part onto the resin molding compound portion of the protective capsule 5 which fills the through openings 8, 10, due to the fact that the resin molding compound itself defines a surface which is planar and continue with the second face 2b of the substrate 2. The contact structures 6 may therefore be arranged almost anywhere within the perimeter of the second face 2b, also in positions corresponding to the through openings 8, 10. This provides a wide margin of flexibility for adapting the connections layout according to design preferences or constraints of boards purchased from suppliers. FIG. 7 shows, purely by way of non-limiting example, some possible arrangements of the connection structures 6 and corresponding connection lines 30 on the second face 2b of the substrate 2 and on the through openings 8, 10.

Figure 8:
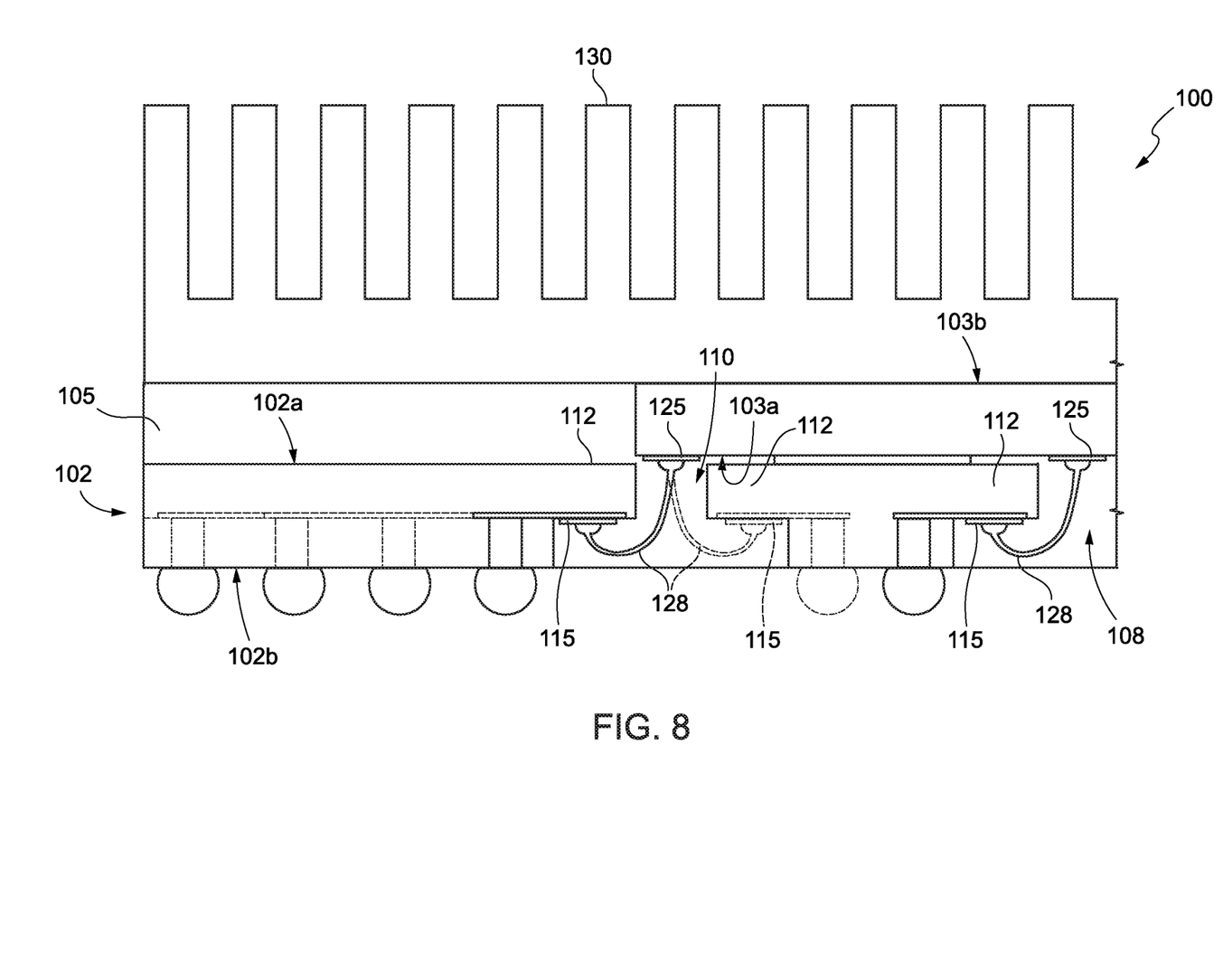
FIG. 8 is a cross-section of a portion of an integrated device according to a further embodiment.

In one embodiment, illustrated in FIG. 8, there are no contact pads around the semiconductor die and on the face of the semiconductor die farthest from the supporting substrate. In this case, in practice, an integrated semiconductor device, indicated by 100, comprises a supporting substrate 102 and a semiconductor die 103 substantially as already described, except for the absence of bonding wires between pads arranged on the first face iota of the supporting substrate 102 and on the second face 103b of the semiconductor die 103. Instead, the supporting substrate 102 has through openings 108,110 with adjacent steps 112 and substrate contact pads 115 on the steps 112. The semiconductor die 103 is provided with die contact pads 125 on the first face 103a bonded to the supporting substrate 102 in positions corresponding to the through openings 108, no. The die contact pads 125 are connected to respective substrate contact pads 115 through bonding wires 128.

In the illustrated embodiment of FIG. 8, the second face 103b of the semiconductor die 103 is coupled to a heat sink 130, which extends in part also around the semiconductor die 103 itself.

A protective capsule 105 laterally surrounds the semiconductor die 103 up to between the supporting substrate 102 and the heat sink 130 and extends to the through openings 108, 110, incorporating the die contact pads 125, the substrate contact pads 115 and the bonding wires 128.

Figure 9:
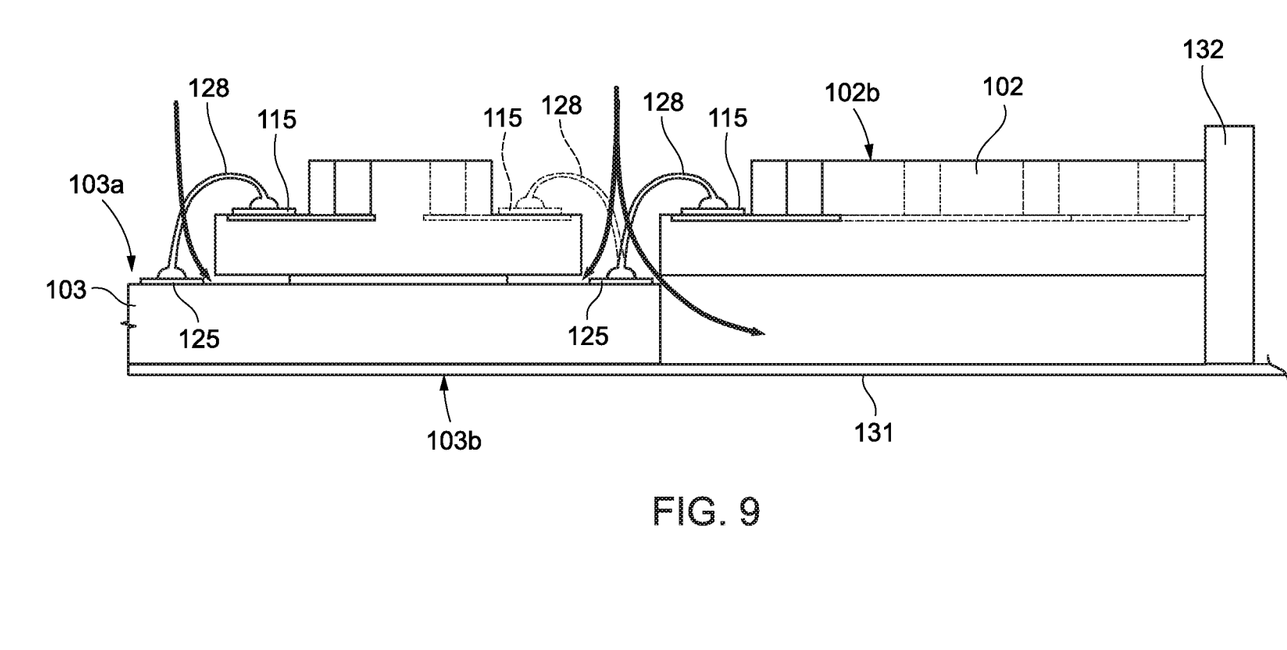
FIG. 9 shows the integrated device of FIG. 7 in an intermediate step of a manufacturing process according to an embodiment.

In this case, after bonding the semiconductor die 103 to the first face 102a of the supporting substrate 102 and forming the bonding wires 128 between the die contact pads 125 and the substrate contact pads 115, the protective capsule 105 is formed through film assisted molding. A sacrificial film 131 (FIG. 9) is arranged in contact with the second face 103b of the semiconductor die 103, which is also laterally surrounded by a mold 132. The resin molding compound is then injected and the sacrificial film 131 is removed, leaving the second face 103b of the semiconductor die exposed for coupling with the heat sink 130.

Embodiments advantageously allow the substrate and die contact pads to be freely arranged and the corresponding bonding wires to be made where most appropriate according to design preferences. The through openings used for the bonding wires may in fact be drawn in an extremely flexible way. In particular, exploiting also internal areas of the semiconductor die is possible, so as to make a greater number of contact pads available and obtain short connections brought directly to the centre of the semiconductor die.

In practice, therefore, the embodiments provide the advantages of robustness and cost-effectiveness of bonding wire techniques and combines contact flexibility and density comparable with those obtainable through the flip chip technique. For example, it is possible to limit the incidence of resistive and inductive parasitic effects related to the length of the connections.

Further advantages are given by the use of steps with a thickness reduced with respect to the supporting substrate to house the substrate contact pads. This measure in fact allows the bonding wires to be formed within the thickness of the supporting substrate, reducing the risks of breakage both during the manufacturing and in the normal use of the integrated device.

Also the manufacturing process is advantageously simple and robust, because both the use of sacrificial materials (the supporting substrate serves directly as a non-sacrificial carrier) and the processing steps necessary to arrange the sacrificial structures may be reduced or removed. Further, the displacements of the semiconductor die (for example through "pick and place") may also be reduced.

Finally, it becomes apparent that modifications and variations may be made to the integrated device and process described, without departing from the scope of the present invention, as defined in the appended claims.

What is claimed is:

1. An integrated semiconductor device comprising:
    a supporting substrate having a first substrate face and a second substrate face opposite to the first substrate face;
    a semiconductor die having a first die face coupled to the first substrate face of the supporting substrate, the first die face comprising first die contact pads in a central portion of the semiconductor die,
    wherein the supporting substrate has at least one through opening,
    wherein the first die contact pads are arranged facing the through opening, and
    wherein the supporting substrate comprises first substrate contact pads connected by first bonding wires to the respective first die contact pads through the through opening; and
    an array of first electric connection structures arranged on the second substrate face in a central portion of the supporting substrate, wherein each of the array of first electric connection structures is coupled to a respective one of the first die contact pads.

2. The integrated semiconductor device according to claim 1, wherein the supporting substrate has a first thickness, defined by a distance between the first substrate face and the second substrate face, and wherein the supporting substrate comprises a step adjacent to the through opening having respective faces parallel to the first substrate face and to the second substrate face and a second thickness smaller than the first thickness.

3. The integrated semiconductor device according to claim 2, wherein the first substrate contact pads are arranged on the step between the first substrate face and the second substrate face.

4. The integrated semiconductor device according to claim 3, wherein the first bonding wires are arranged so that they not project beyond the second substrate face.

5. The integrated semiconductor device according to claim 2, wherein the supporting substrate comprises a plurality of steps around the through opening.

6. The integrated semiconductor device according to claim 5, wherein the supporting substrate has a plurality of through openings, each through opening having at least one adjacent step.

7. The integrated semiconductor device according to claim 6, wherein a respective group of the first die contact pads faces a respective through opening, and wherein the respective group of the first substrate contact pads is arranged on a respective step.

8. The integrated semiconductor device according to claim 1, further comprising adhesive tape strips arranged around the through opening, and wherein the semiconductor die is bonded to the supporting substrate by the adhesive tape strips.

9. The integrated semiconductor device according to claim 8, wherein each adhesive tape strips has a thickness such that at least one passage is created between the supporting substrate and the semiconductor die.

10. The integrated semiconductor device according to claim 1, further comprising:
a protective capsule surrounding the semiconductor die, the protective capsule comprising a resin, the resin further filling the through opening with the first bonding wires.

11. The integrated semiconductor device according to claim 1, wherein the semiconductor die has a second die face, opposite to the first die face, wherein second die contact pads are arranged on the second die face, and wherein the supporting substrate has second substrate contact pads arranged around the semiconductor die and connected via second bonding wires to the second die contact pads.

12. The integrated semiconductor device according to claim 11, further comprising an array of second electric connection structures arranged on the second substrate face in a peripheral portion of the supporting substrate, wherein each of the second electric connection structures is connected to a respective one of the second substrate contact pad.

13. The integrated semiconductor device according to claim 12, wherein the array of the first and the second electric connection structures are BGA (Ball Grid Array) balls.

14. A method for manufacturing an integrated semiconductor device, the method comprising:
providing a supporting substrate having a first substrate face and a second substrate face opposite to the first substrate face and at least one through opening;
forming substrate contact pads on the supporting substrate;
providing a semiconductor die having a die face with die contact pads arranged on the die face in a central portion of the semiconductor die;
bonding the semiconductor die to the first substrate face of the supporting substrate with the die contact pads facing through opening;
arranging bonding wires between the substrate contact pads and respective die contact pads; and
providing an array of first electric connection structures arranged on the second substrate face in a central portion of the supporting substrate, the central portion of the supporting substrate overlapping with the central portion of the semiconductor die, each of the array of first electric connection structures being coupled to a respective one of the die contact pads.

15. The method according to claim 14, wherein providing the supportingsubstrate comprises forming a step in the supporting substrate adjacent to the through opening, wherein the step has faces parallel to the first substrate face and to the second substrate face, and wherein the step has a second thickness smaller than a first thickness defined by a distance between the first substrate face and the second substrate face.

16. The method according to claim 15, further comprising providing the substrate contact pads on the step between the first substrate face and the second substrate face.

17. The method according to claim 14, further comprising arranging adhesive tape strips around the through opening, wherein bonding the semiconductor die comprises bonding the semiconductor die by the adhesive tape strips to the supporting substrate.

18. The method according to claim 14, further comprising forming an array of second electric connection structures on the second substrate face in a peripheral portion of the supporting substrate, each of the array of second electric connection structures being coupled to a respective contact pad located at a peripheral portion of the semiconductor die.

19. The integrated semiconductor device according to claim 1, wherein the array of first electric connection structures are disposed directly over the at least one through opening.

20. The integrated semiconductor device according to claim 1, wherein the array of first electric connection structures are coupled to the first substrate contact pads through conduction lines formed over the at least one through opening filled with a resin incorporating the first bonding wires.

21. The integrated semiconductor device according to claim 10, further comprising a heat sink contacting a major surface of the protective capsule and a second die face of the semiconductor die, the second die face being opposite to the first die face.

22. A method for manufacturing an integrated semiconductor device, the method comprising:
providing a supporting substrate having a first substrate face and a second substrate face opposite to the first substrate face and a central through opening disposed in a central portion of the supporting substrate, a plurality of peripheral through openings disposed in a peripheral portion of the supporting substrate, the peripheral portion being disposed around the central portion;
forming first substrate contact pads and second substrate contact pads on the supporting substrate;
providing a semiconductor die having a die face with first die contact pads facing the central through opening and second die contact pads facing the plurality of peripheral through openings, the first die contact pads being located in a central portion of the semiconductor die;
bonding the semiconductor die to the first substrate face of the supporting substrate; and
arranging first bonding wires between the first substrate contact pads and respective first die contact pads;
arranging second bonding wires between the second substrate contact pads and respective second die contact pads;
providing an array of first electric connection structures arranged on the second substrate face in the central portion of the supporting substrate, the central portion of the supporting substrate overlapping with the central portion of the semiconductor die, each of the array of first electric connection structures being coupled to a respective one of the first die contact pads; and
providing an array of second electric connection structures arranged on the second substrate face in the peripheral portion of the supporting substrate, each of the array of second electric connection structures being coupled to a respective one of the second die contact pads.

23. The method of claim 22, wherein one of the array of first electric connection structures is formed directly over the central through opening.

24. The method of claim 22, further comprising:
filling the central through opening and the plurality of peripheral through openings with a resin, the resin formed around the semiconductor die.

25. The method of claim 24, further comprising
attaching a heat sink to a major surface of the resin and the semiconductor die.

* * * * *